US012586524B2

(12) United States Patent
Du et al.

(10) Patent No.: US 12,586,524 B2
(45) Date of Patent: Mar. 24, 2026

(54) PIXEL CIRCUIT AND DISPLAY PANEL

(71) Applicants:Hefei Visionox Technology Co., Ltd., Anhui (CN); KunShan Go-Visionox Opto-Electronics Co., Ltd, Jiangsu (CN)

(72) Inventors: Yongqiang Du, Kunshan (CN); Chunlei Zhang, Kunshan (CN)

(73) Assignees: Hefei Visionox Technology Co., Ltd., Hefei (CN); KunShan Go-Visionox Opto-Electronics Co., Ltd, Kunshan (CN)

( * ) Notice: Subject to any disclaimer, the term of this patent is extended or adjusted under 35 U.S.C. 154(b) by 0 days.

(21) Appl. No.: 18/644,671

(22) Filed: Apr. 24, 2024

(65) Prior Publication Data

US 2024/0355285 A1     Oct. 24, 2024

Related U.S. Application Data

(63) Continuation of application No. PCT/CN2023/136028, filed on Dec. 4, 2023.

(30) Foreign Application Priority Data

Apr. 21, 2023     (CN) .......................... 202310445544.8

(51) Int. Cl.
*G09G 3/3233* (2016.01)
*H10K 59/122* (2023.01)
*H10K 59/131* (2023.01)
(52) U.S. Cl.
CPC ......... *G09G 3/3233* (2013.01); *H10K 59/122* (2023.02); *H10K 59/131* (2023.02);
(Continued)

(58) Field of Classification Search
CPC ......... G09G 3/3233; G09G 2300/0842; G09G 2320/0233; G09G 3/3208;
(Continued)

(56) References Cited

U.S. PATENT DOCUMENTS

2013/0106307 A1*  5/2013  Tan ..................... G09G 3/3225
                                                          315/291
2016/0232840 A1   8/2016  Tseng et al.
(Continued)

FOREIGN PATENT DOCUMENTS

CN      1728219 A      2/2006
CN      103035201 A    4/2013
(Continued)

OTHER PUBLICATIONS

International Search Report issued Feb. 22, 2024, in corresponding International Application No. PCT/CN2023/136028, 8 pages.
(Continued)

*Primary Examiner* — Temesghen Ghebretinsae
*Assistant Examiner* — Ivelisse Martinez Quiles
(74) *Attorney, Agent, or Firm* — Maier & Maier, PLLC

(57)     ABSTRACT

A pixel circuit and a display panel. The pixel circuit includes a drive circuit, a first reset circuit, a data write circuit, a first light emission control circuit, a second light emission control circuit and a storage circuit. The first reset circuit is connected to the drive circuit; the data write circuit is connected to the drive circuit; the first light emission control circuit is connected in series with a light-emitting element between a positive voltage power supply and the drive circuit; the second light emission control circuit is connected between the drive circuit and a negative voltage power supply; the storage circuit is electrically connected to the drive circuit.

16 Claims, 9 Drawing Sheets

(52) U.S. Cl.
CPC ............... *G09G 2300/0426* (2013.01); *G09G 2300/0842* (2013.01); *G09G 2300/0861* (2013.01); *G09G 2310/08* (2013.01); *G09G 2320/0233* (2013.01)

(58) Field of Classification Search
CPC ... G09G 2300/0426; G09G 2300/0861; G09G 2310/00; G09G 2320/023; G09G 2300/043; G09G 2310/061; G09G 2320/0626; H10K 59/122; H10K 59/131; H10K 59/12; H10K 59/123
See application file for complete search history.

(56)     References Cited

U.S. PATENT DOCUMENTS

| | | | | |
|---|---|---|---|---|
| 2021/0335974 | A1* | 10/2021 | Zhou | G09G 3/3233 |
| 2022/0180819 | A1 | 6/2022 | Ono et al. | |
| 2023/0063644 | A1 | 3/2023 | Chung | |
| 2023/0178023 | A1* | 6/2023 | Kim | H01L 25/167 |
| | | | | 345/690 |
| 2023/0351944 | A1* | 11/2023 | Han | G09G 3/3233 |
| 2023/0419895 | A1* | 12/2023 | Liu | G09G 3/3233 |

FOREIGN PATENT DOCUMENTS

| | | |
|---|---|---|
| CN | 107230451 A | 10/2017 |
| CN | 109935730 A | 6/2019 |
| CN | 112767881 A | 5/2021 |
| CN | 112951882 A | 6/2021 |
| CN | 113889029 A | 1/2022 |
| CN | 114843424 A | 8/2022 |
| CN | 115376463 A | 11/2022 |
| CN | 115602236 A | 1/2023 |
| JP | 2006039544 A | 2/2006 |
| JP | 2007103126 A | 4/2007 |
| JP | 2021518920 A | 8/2021 |
| JP | 2022185819 A | 12/2022 |
| KR | 1020230045190 A | 4/2023 |

OTHER PUBLICATIONS

Office Action issued on Feb. 23, 2025, in corresponding Korean Application No. 10-2024-7034304, 11 pages.
Office Action issued on Sep. 9, 2025, in corresponding Japanese Application No. 2024-551626, 12 pages.
Office Action issued on Dec. 22, 2025, in corresponding Korean Application No. 10-2024-7034304, 10 pages.

* cited by examiner

PIXEL CIRCUIT AND DISPLAY PANEL

CROSS-REFERENCE TO RELATED APPLICATIONS

This application is a continuation application of International Patent Application No. PCT/CN2023/136028, filed on Dec. 4, 2023, which claims priority to Chinese Patent Application No. 202310445544.8 filed on Apr. 21, 2023, the disclosures of which are incorporated herein by reference in their entireties.

TECHNICAL FIELD

The present application relates to the field of display technology, for example, a pixel circuit and a display panel.

BACKGROUND

With the continuous development of display technology, display panels are increasingly widely used, and users have higher and higher requirements for display panels. The pixel circuit of a display panel plays a very important role in driving stable light emission of light-emitting elements of the display panel. However, in the display process of the pixel circuit in the related art, the potential at the gate of the drive transistor is unstable, affecting the stable output of a drive current, affecting the display brightness of the light-emitting element, and thus affecting the display uniformity of the display panel.

SUMMARY

The present application provides a pixel circuit and a display panel.

In a first aspect, embodiments of the present application provide a pixel circuit. The pixel circuit includes a drive circuit, a first reset circuit, a data write circuit, a first light emission control circuit, a second light emission control circuit and a storage circuit.

The drive circuit is configured to generate a drive current according to a potential at a control terminal of the drive circuit.

The first reset circuit is connected to the control terminal of the drive circuit and configured to transmit a first reset signal to the control terminal of the drive circuit in response to a first scan signal.

The data write circuit is connected to the drive circuit and configured to transmit a data voltage to the drive circuit in response to a second scan signal.

The first light emission control circuit is connected in series with a light-emitting element between a positive voltage power supply and a second terminal of the drive circuit, and the first light emission control circuit is configured to be turned on in response to a light emission control signal so that a first power supply signal provided by the positive voltage power supply is transmitted through a cathode of the light-emitting element to the second terminal of the drive circuit.

The second light emission control circuit is connected between a first terminal of the drive circuit and a negative voltage power supply and configured to be turned on in response to the light emission control signal.

The storage circuit is connected to the control terminal of the drive circuit and configured to store the potential at the control terminal of the drive circuit.

In a second aspect, the embodiments of the present application further provide a display panel. The display panel includes the pixel circuit provided in any embodiment of the present application.

On the basis that cathodes of multiple light-emitting elements are isolated, and thus potentials at the cathodes of the multiple light-emitting elements can be individually controlled, the embodiments of the present application provide a circuit structure where the cathode of the light-emitting element accesses the pixel circuit. The cathode of the light-emitting element is directly or indirectly connected to the second terminal of the drive module, so the first terminal of the drive module can be connected to the negative voltage power supply through the second light emission control module. In the light emission stage, the second light emission control module is turned on, the first terminal of the drive module stably accesses the second power supply signal provided by the negative voltage power supply to keep the potential at the first terminal of the drive module unchanged. Moreover, the storage module 60 is disposed. The storage module can provide the function of storing charges and preserving the potential to keep the potential at the control terminal of the drive module unchanged. Therefore, the pixel circuit provided in the embodiments of the present application can control the potentials at the control terminal and the first terminal of the drive module to be unchanged in the light emission stage. Compared to the scheme in the related art that gate potentials and source potentials of the drive transistor both change in the light emission stage, the embodiments of the present application are easier to ensure that the potential difference between the control terminal and the first terminal of the drive module remains unchanged, so the drive current output by the drive module remains unchanged, and the brightness of the light-emitting element remains unchanged in the light emission stage, which is conducive to improving the display uniformity of the display panel. Moreover, the storage module in the embodiments of the present application only needs to provide the function of keeping the potential, without the need for providing the coupling function, which can reduce the impact of the storage module on the light-emitting element and lower the design requirements for the storage module; therefore, the structure of the storage module and the layout of the storage module in the display panel can be set more flexibly.

DETAILED DESCRIPTION

The terms "first", "second" and the like in the description, claims and above drawings of the present application are used for distinguishing between similar objects and are not necessarily used for describing a particular order or sequence. It is to be understood that data used in this manner is interchangeable in appropriate cases so that the embodiments of the present application described herein can also be implemented in an order not illustrated or described herein. In addition, terms "comprising", "including" and any other variations thereof are intended to encompass a non-exclusive inclusion.

As described in the background, for the pixel circuit in the related art, during the display process, the gate potential of the drive transistor is not stable, affecting the display uniformity of the display panel. After the research by the applicant, reasons for the preceding situation are described below.

In the related art, pixel circuits in small-sized display products are generally low-temperature polycrystalline silicon (LTPS) pixel circuits, that is, all transistors in the pixel circuit are P-type transistors; or pixel circuits in small-sized display products are low-temperature polycrystalline oxide (LTPO) pixel circuits, that is, some transistors in the pixel circuit are P-type transistors, and other transistors in the pixel circuit are N-type transistors. In the preceding pixel circuit, drive transistors are all P-type transistors. However, in medium/large-sized products, due to the high leakage current and poor long-range uniformity of P-type transistors, the applicability of the preceding pixel circuit is reduced; medium/large-sized products prepared by using the preceding pixel circuit are prone to poor brightness uniformity. Therefore, in the field of medium/large-sized products, pixel circuits based on indium gallium zinc oxide (IGZO), that is, pixel circuits where all transistors are N-type transistors, are proposed to take advantage of the low leakage current and good long-range uniformity of N-type IGZO transistors to improve the display uniformity.

Figure 1:
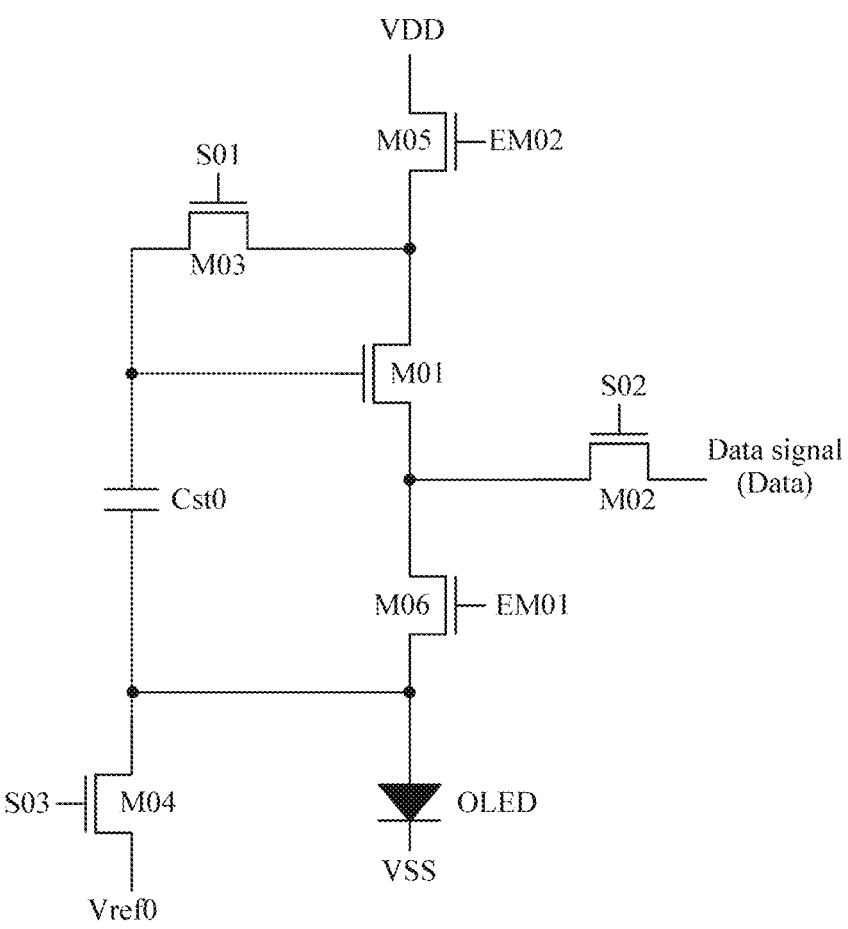
FIG. 1 is a structural diagram of a pixel circuit in the related art.
Figure 2:
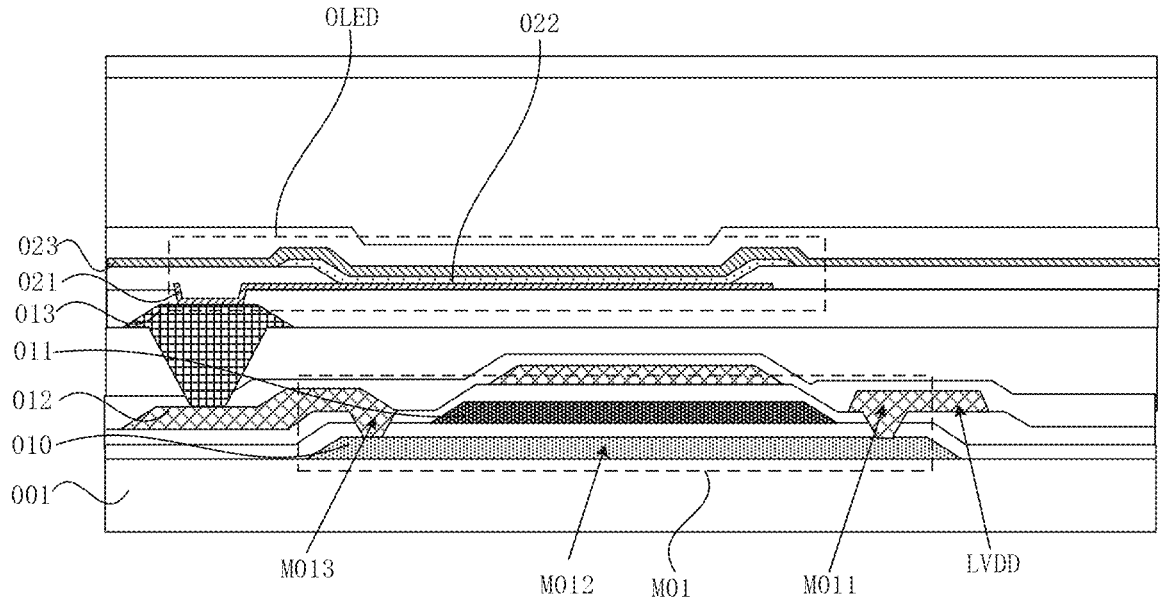
FIG. 2 is a structural view of film layers of a pixel circuit in the related art.

FIG. 1 is a structural diagram of a pixel circuit in the related art. Referring to FIG. 1, an all-N-type pixel circuit in the related art includes a drive transistor M01 and switch transistors M02 to M06. The signals that the transistors access include: scan signals S01, S02 and S03, light emission control signals EM01 and EM02, a first power supply signal VDD, a second power supply signal VSS, a data voltage Data and a reset signal Vref0. FIG. 2 is a structural view of film layers of a pixel circuit in the related art. FIG. 2 omits the structures of the switch transistors M05 and M06, and mainly shows the connection structure between the drive transistor M01 and a light-emitting element OLED. In actual preparation, the drive transistor M01 may be connected to the light-emitting element OLED through the switch transistor M06. Referring to FIG. 1 and FIG. 2, the film structure of the all-N-type pixel circuit in the related art follows the film structure of the LTPS pixel circuit, including an active layer 010, a first metal layer 011, a second metal layer 012 and a third metal layer 013 which are laminated on a substrate 001. The light-emitting element OLED also adopts a common-cathode structure, that is, cathodes of multiple light-emitting elements OLED in the display panel are set as an entire surface and access the same cathode voltage VSS. The light-emitting element OLED includes an anode 021, a light emission function layer 022 and a cathode 023 which are laminated on a side of the third metal layer 013 away from the substrate 001. The anode of the light-emitting element OLED is connected to the pixel circuit, and the pixel circuit individually controls the potential at the anode of the corresponding light-emitting element OLED.

After the drive transistor M01 is adjusted to an N-type transistor and connected to the anode of the light-emitting element OLED, since the current flow of the light-emitting element OLED during light emission is from the anode to the cathode, a source of the drive transistor M01 is connected to the anode of the light-emitting element OLED. For example, omitting switch transistors M05 and M06, the current in a light emission stage sequentially passes through the following path: a power supply line LVDD (configured to transmit a power supply signal VDD), a drain M011 of the drive transistor M01, a channel region M012 of the drive transistor M01, the source M013 of the drive transistor M01, the anode 021 of the light-emitting element OLED, the light emission function layer 022 and the cathode 023 of the light-emitting element OLED. When the light-emitting element OLED emits light, the potential at the anode of the light-emitting element OLED changes, which causes the gate-source voltage difference of the drive transistor M01 to continuously change during the light emission process, resulting in an unstable drive current output by the drive transistor M01. To avoid the preceding situation, a capacitor Cst0 is disposed in the pixel circuit in the related art. The capacitor Cst0 is connected to a gate of the drive transistor M01 and the anode of the light-emitting element OLED. When the switch transistor M06 is turned on, the capacitor Cst0 is equivalent to being connected between the gate and the source of the drive transistor M01. In the light emission stage, the capacitor Cst0 is configured to maintain the gate-source voltage difference of the drive transistor M01 based on the coupling effect of the capacitor Cst0. However, the capacitance coupling effect is affected by the capacitance of the capacitor Cst0, so the gate-source voltage difference of the drive transistor M01 cannot be kept 100% unchanged. Moreover, under this design, the capacitor Cst0 not only affects the charging efficiency during a data writing process, but also affects the gate potential of the drive transistor M01 after capacitance coupling in the light emission stage. It can be seen that the capacitance magnitude greatly affects the drive current.

In summary, in the related art, since the light-emitting element OLED uses the common-cathode structure, the pixel circuit based on all-N-type transistors can only be connected to the anode of the light-emitting element OLED to achieve individual control on the anode potential of the light-emitting element OLED. The preceding limitations result in that in the light emission stage, the gate-source voltage difference of the drive transistor in the pixel circuit is unstable, leading to the unstable drive current output by the pixel circuit and affecting the display uniformity.

In the embodiments of preset application, the applicant designs the element structure that cathodes of light-emitting elements are individually separated, and designs the pixel circuit structure that the drive transistor is electrically connected to the cathode of the light-emitting element and thus can individually control the cathode potential of the light-emitting element, so the gate potential of the drive transistor in the pixel circuit can be stabilized during the light emission stage. In the preparation process of the display panel, isolating structures may be disposed for separating cathodes of adjacent light-emitting elements, so cathodes of multiple light-emitting elements are connected to corresponding pixel circuits respectively, and thus the pixel circuits can individually control cathodes potentials of the multiple light-emitting elements. The structure and the working principle of the pixel circuit as well as the connection relationship between light-emitting elements and pixel circuits are first described below.

Figure 3:
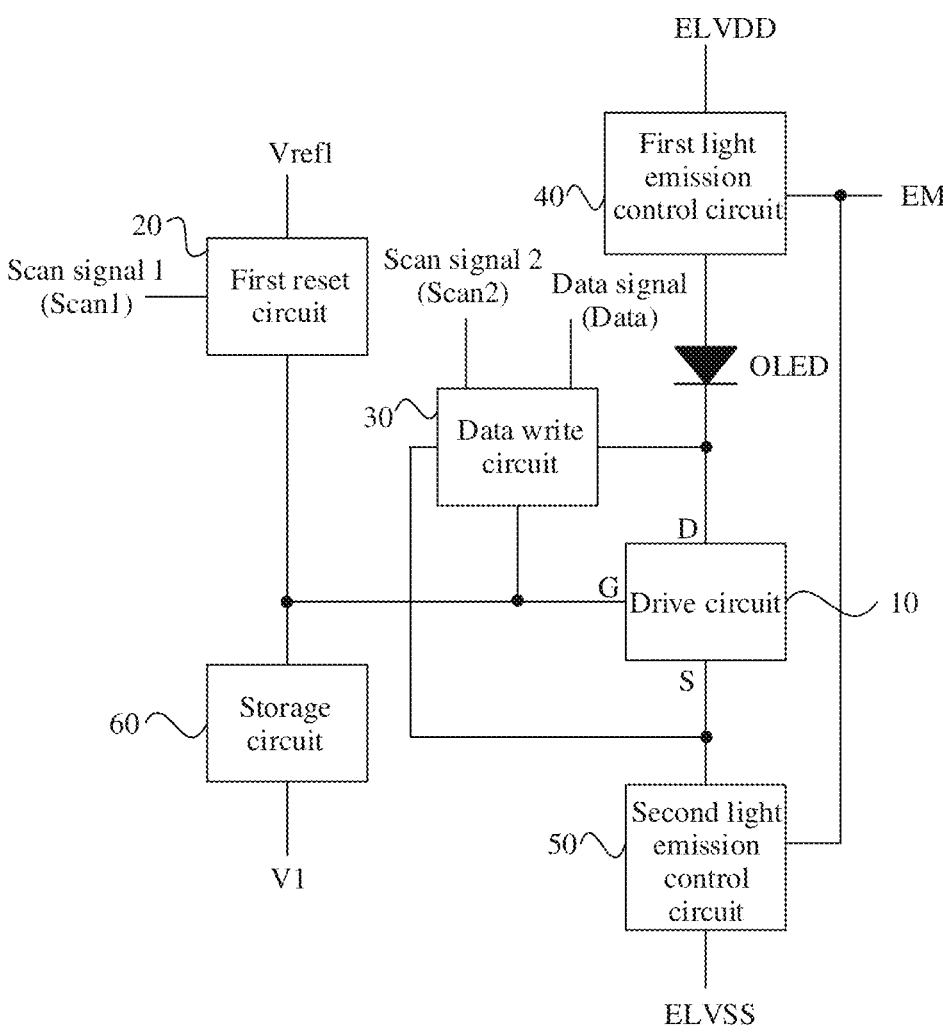
FIG. 3 is a structural diagram of a pixel circuit according to an embodiment of the present application.

FIG. 3 is a structural diagram of a pixel circuit according to an embodiment of the present application. Referring to FIG. 3, the pixel circuit includes a drive circuit/module 10, a first reset circuit/module 20, a data write circuit/module 30, a first light emission control circuit/module 40, a second light emission control circuit/module 50 and a storage circuit/module 60. In one or more embodiments of the present application, a circuit may also be understood as a module. For example, a drive circuit may be understood as a drive module, a data write circuit may be understood as a data write module, and so on.

The drive circuit 10 is configured to generate a drive current according to the potential at a control terminal G of the drive circuit 10. The first reset circuit 20 is connected to the control terminal G of the drive circuit 10, and the first reset circuit 20 is configured to transmit a first reset signal Vref1 to the control terminal G of the drive circuit 10 in response to a first scan signal Scan1. The data write circuit 30 is connected to the drive circuit 10, and the data write circuit 30 is configured to transmit a data voltage Data to the drive circuit 10 in response to a second scan signal Scan2. The first light emission control circuit 40 is connected in series with a light-emitting element OLED between a positive voltage power supply and a second terminal D of the drive circuit 10, and the first light emission control circuit 40 is configured to be turned on in response to a light emission control signal EM so that a first power supply signal ELVDD provided by the positive voltage power supply is transmitted through a cathode of the light-emitting element OLED to the second terminal D of the drive circuit 10. The second light emission control circuit 50 is connected between a first terminal S of the drive circuit 10 and a negative voltage power supply, and the second light emission control circuit 50 is configured to be turned on in response to the light emission control signal EM. The storage circuit 60 is connected to the control terminal G of the drive circuit 10, and the storage circuit 60 is configured to store the potential at the control terminal G of the drive circuit 10.

Exemplarily, the specific connection manner of multiple circuits in the pixel circuit may be that a control terminal of the first reset circuit 20 is connected to a first scan line to access a first scan signal Scan1; a first terminal of the first reset circuit 20 is connected to a first reset signal line to access the first reset signal Vref1; a second terminal of the first reset circuit 20 is connected to the control terminal G of the drive circuit 10. A control terminal of the data write circuit 30 is connected to a second scan line to access the second scan signal Scan2; a first terminal of the data write circuit 30 is connected to a data line to access the data voltage Data, a second terminal of the data write circuit 30 is connected to the first terminal S of the drive circuit 10, a third terminal of the data write circuit 30 is connected to the control terminal G of the drive circuit 10; a fourth terminal of the data write circuit 30 is connected to the second terminal D of the drive circuit; the data write circuit 30 is configured to transmit a signal carrying information of the data voltage Data and information of the threshold voltage of the drive circuit 10 to the control terminal G of the drive circuit 10. A control terminal of the first light emission control circuit 40 is connected to a light emission control signal line to access the light emission control signal EM; a first terminal of the first light emission control circuit 40 is connected to a first power supply signal line to access the first power supply signal ELVDD output by the positive voltage power supply; a second terminal of the first light emission control circuit 40 is connected to the anode of the light-emitting element OLED. The cathode of the light-emitting element OLED is connected to the second terminal D of the drive circuit 10. A control terminal of the second light emission circuit 50 is connected to the light emission control signal line to access the light emission control signal EM; a first terminal of the second light emission control circuit 50 is connected to the first terminal S of the drive circuit 10; a second terminal of the second light emission control circuit 50 is connected to a second power supply signal line to access a second power supply signal ELVSS output by the negative voltage power supply. A first terminal of the storage circuit 60 is connected to the control terminal G of the drive circuit 10, a second terminal of the storage circuit 60 is connected to a fixed potential signal line to access a fixed potential signal V1 to maintain the potential at the control terminal G of the drive circuit 10.

The first scan signal Scan1, the second scan signal Scan2 and the light emission control signal EM are each a scan signal with alternating high and low potentials; the first power supply signal ELVDD, the second power supply signal ELVSS, the first reset signal Vref1 and the fixed potential signal V1 are each a direct current (DC) voltage signal with a fixed potential. Exemplarily, the first power supply signal ELVDD and the first reset signal Vref1 are high potential signals, and the second power supply signal ELVSS is a low potential signal.

Figure 4:
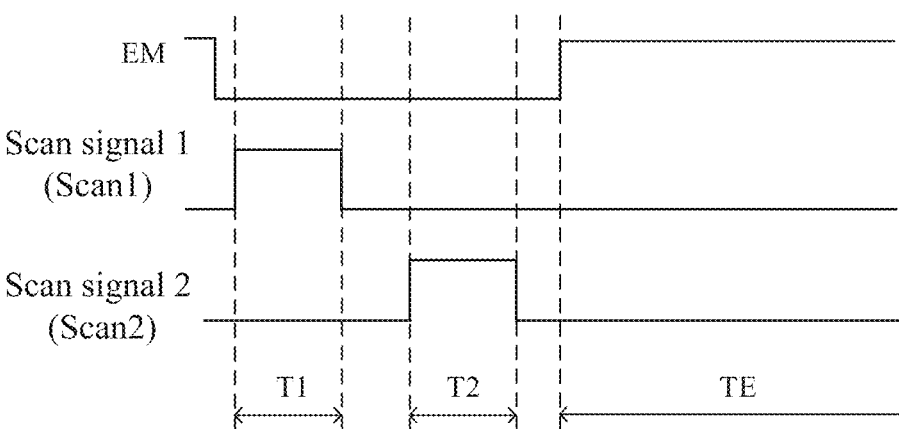
FIG. 4 is a drive timing diagram of a pixel circuit according to an embodiment of the present application.

FIG. 4 is a drive timing diagram of a pixel circuit according to an embodiment of the present application. Referring to FIG. 3 and FIG. 4, an example where turning-on potentials of multiple function circuits are all high potentials is illustrated. The driving process of the pixel circuit includes a gate reset stage T1, a data write stage T2 and a light emission stage TE.

In the gate reset stage T1, the first scan signal Scan1 is at high potential, and the second scan signal Scan2 and the light emission control signal EM are each at low potential. The first reset circuit 20 is turned on and transmits the first reset signal Vref1 to the control terminal G of the drive circuit 10. In this stage, the first reset signal Vref1 resets the control terminal G of the drive circuit 10, preparing for the subsequent data writing and ensuring that the drive circuit 10 can be reliably turned on in the data write stage T2.

In the data write stage T2, the second scan signal Scan2 is at a high potential, and the first scan signal Scan1 and the light emission control signal EM are each at a low potential. The data write circuit 30 is turned on and writes the data voltage Data to the control terminal G of the drive circuit 10 through the first terminal S and the second terminal D of the drive circuit 10.

In the light emission stage TE, the light emission control signal EM is at a high potential, and the first scan signal Scan1 and the second scan signal Scan2 are each at a low potential. The first light emission control circuit 40 and the second light emission control circuit 50 are each turned on so that the series path, between the positive voltage power supply and the negative voltage power supply, of the drive circuit 10 and the light-emitting element OLED is turned on. The drive circuit 10 generates a drive current to drive the light-emitting element OLED to emit light. In this stage, based on the storage function of the storage circuit 60, the potential at the control terminal G of the drive circuit 10 is stably maintained at the potential written in the data write stage T2. The second power supply signal ELVSS is transmitted through the second light emission control circuit 50 to the first terminal S of the drive circuit 10; since the potential of the second power supply signal ELVSS remains unchanged, the potential at the first terminal S of the drive circuit 10 also remains unchanged. Therefore, the potential difference between the control terminal G and the first terminal S of the drive circuit 10 remains unchanged during the light emission stage TE, allowing the drive circuit 10 to stably output a drive current of the same magnitude based on this potential difference during the light emission stage TE and thus to drive the light-emitting element OLED to stably emit light.

On the basis that cathodes of multiple light-emitting elements OLED are isolated, and thus potentials at the cathodes of the multiple light-emitting elements OLED can be individually controlled, the embodiments of the present application provide the circuit structure where the cathode of the light-emitting element OLED accesses the pixel circuit. The cathode of the light-emitting element OLED is directly or indirectly connected to the second terminal D of the drive circuit 10, so the first terminal S of the drive circuit 10 can be connected to the negative voltage power supply through the second light emission control circuit 50. In the light emission stage, the second light emission control circuit 50 is turned on, the first terminal S of the drive circuit 10 stably accesses the second power supply signal ELVSS provided by the negative voltage power supply to keep the potential at the first terminal S of the drive circuit 10 unchanged. Moreover, the storage circuit 60 is disposed. The storage circuit 60 can provide the function of storing charges and preserving the potential to keep the potential at the control terminal G of the drive circuit 10 unchanged. Therefore, the pixel circuit provided in the embodiments of the present application can control the potentials at the control terminal G and the first terminal S of the drive circuit 10 to be unchanged in the light emission stage. Compared to the scheme in the related art that gate potentials and source potentials of the drive transistor both change in the light emission stage, the embodiments of the present application are easier to ensure that the potential difference between the control terminal G and the first terminal S of the drive circuit 10 remains unchanged, so the drive current output by the drive circuit 10 remains unchanged, and the brightness of the light-emitting element OLED remains unchanged in the light emission stage, which is conducive to improving the display uniformity of the display panel. Moreover, the storage circuit 60 in the embodiments of the present application just needs to provide the function of keeping the potential, does not need to provide the coupling function, which can reduce the impact of the storage circuit 60 on brightness of the light-emitting element OLED and lower the design requirements for the storage circuit 60; therefore, the structure of the storage circuit 60 and the layout of the storage circuit 60 in the display panel can be set more flexibly.

Figure 5:
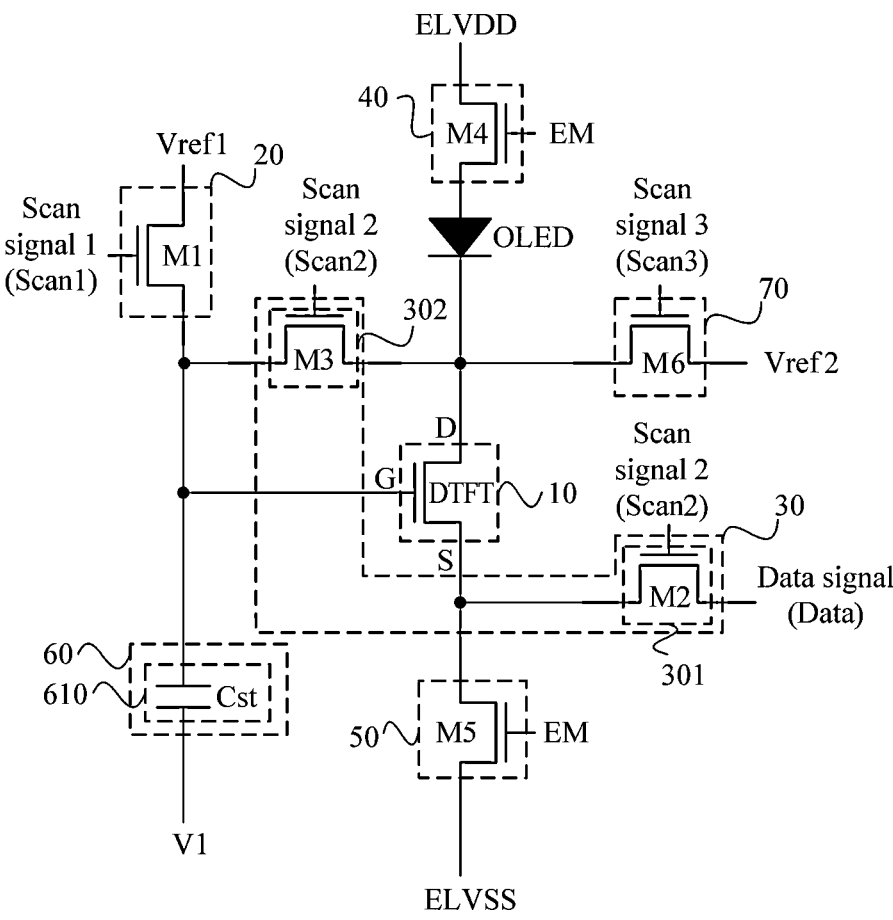
FIG. 5 is a structural diagram of another pixel circuit according to an embodiment of the present application.

FIG. 5 is a structural diagram of another pixel circuit according to an embodiment of the present application. Referring to FIG. 5, on the basis of the preceding embodiments, for example, the drive circuit 10 includes a drive transistor DTFT. A gate of the drive transistor DTFT serves as the control terminal G of the drive circuit 10, a first electrode of the drive transistor DTFT serves as the first terminal S of the drive circuit 10, and a second electrode of the drive transistor DTFT serves as the second terminal D of the drive circuit 10. In the embodiment, the drive circuit 10 includes one transistor so that the drive circuit 10 has a simple structure and is easy to implement. Exemplarily, the first electrode of the drive transistor DTFT is a source of the drive transistor DTFT, and the second electrode of the drive transistor DTFT is a drain of the drive transistor DTFT.

With continued reference to FIG. 5, on the basis of the preceding embodiments, for example, the first reset circuit 20 includes a first transistor M1, a gate of the first transistor M1 is connected to the first scan line, a first electrode of the first transistor M1 is connected to the control terminal G of the drive circuit 10, and a second electrode of the first transistor M1 is connected to the first reset signal line. In the embodiment, the first reset circuit 20 includes one transistor so that the first reset circuit 20 has a simple structure and is easy to implement.

With continued reference to FIG. 5, on the basis of the preceding embodiments, for example, the data write circuit 30 includes a data write unit 301 and a threshold compensation unit 302. The data write unit 301 is connected to the first terminal S of the drive circuit 10, and the data write circuit 301 is configured to be turned on in response to the second scan signal Scan2 and transmit the data voltage Data to the first terminal S of the drive circuit 10. The threshold compensation unit 302 is connected between the control terminal G and the second terminal D of the drive circuit 10, and the threshold compensation unit 302 is configured to be turned on in response to the second scan signal Scan2 and perform threshold voltage compensation on the drive circuit 10.

For example, the data write unit 301 includes a second transistor M2, and the threshold compensation unit 302 includes a third transistor M3. A gate of the second transistor M2 and a gate of the third transistor M3 are each connected to the second scan line, a first electrode of the second transistor M2 is connected to the data line, a second electrode of the second transistor M2 is connected to the first terminal S of the drive circuit 10, a first electrode of the third transistor M3 is connected to the control terminal G of the drive circuit 10, and a second electrode of the third transistor M3 is connected to the second terminal D of the drive circuit 10. In the embodiment, the third transistor M3 is connected between the gate and the second electrode of the drive transistor DTFT. When the second transistor M2 and the third transistor M3 are each turned on in response to the second scan signal Scan2, the gate and the second electrode of the drive transistor DTFT are connected, forming a diode connection form. The data voltage Data can be written into the first electrode of the drive transistor DTFT through the second transistor M2, and then is written into the gate of the drive transistor DTFT through the drive transistor DTFT and the third transistor M3. When the potential difference between the gate and the first electrode of the drive transistor DTFT is equal to the threshold voltage Vth of the drive transistor DTFT, the drive transistor DTFT is turned off.

Therefore, the potential of the gate of the drive transistor DTFT is kept at the value of Data+Vth, that is, the information of both the data voltage Data and the threshold voltage of the drive transistor DTFT is stored, which is conducive to eliminating the impact of the threshold voltage drift of the drive transistor DTFT on the drive current in the subsequent light emission stage and compensating for the impact of the non-uniform threshold voltage of the drive transistor DTFT on the display effect.

With continued reference to FIG. 5, on the basis of the preceding embodiments, for example, the first light emission control circuit 40 includes a fourth transistor M4, a gate of the fourth transistor M4 is connected to the light emission control signal line, and the fourth transistor M4 is connected in series with the light-emitting element OLED between the positive voltage power supply and the second terminal D of the drive circuit 10. For example, a first electrode of the fourth transistor M4 accesses the first power supply signal ELVDD, a second electrode of the fourth transistor M4 is connected to the anode of the light-emitting element OLED, and the cathode of the light-emitting element OLED is connected to the second terminal D of the drive circuit 10. In the embodiment, the first light emission control circuit 40 includes one transistor so that the first light emission control circuit 40 has a simple structure and is easy to implement.

With continued reference to FIG. 5, on the basis of the preceding embodiments, for example, the second light emission control circuit 50 includes a fifth transistor M5, a gate of the fifth transistor M5 is connected to the light emission control signal line, a first electrode of the fifth transistor M5 is connected to the first terminal S of the drive circuit 10, and a second electrode of the fifth transistor M5 is connected to the negative voltage power supply. In the embodiment, the second light emission control circuit 50 includes one transistor so that the second light emission control circuit 50 has a simple structure and is easy to implement.

On the basis of the preceding embodiments, for example, the first terminal of the storage circuit 60 is connected to the control terminal G of the drive circuit 10, the second terminal of the storage circuit 60 may access at least one fixed potential signal, so as to provide the potential keeping effect. As shown in FIG. 5, exemplarily, the storage circuit 60 accesses a fixed potential signal. The storage circuit 60 includes a storage unit 610, a first terminal of the storage unit 610 is connected to the control terminal G of the drive circuit 10, and a second terminal of the storage unit 610 accesses the fixed potential signal V1. For example, the storage unit 610 may include a capacitor Cst, a first terminal of the capacitor Cst serves as the first terminal of the storage unit 610, and a second terminal of the capacitor Cst serves as the second terminal of the storage unit 610. In the embodiment, the storage unit 610 includes the capacitor Cst so that the storage unit 610 has a simple structure and is easy to implement.

With continued reference to FIG. 5, on the basis of the preceding embodiments, for example, the pixel circuit further includes a second reset circuit/module 70, the second reset circuit 70 is electrically connected to the cathode of the light-emitting element OLED and configured to transmit a second reset signal Vref2 to the cathode of the light-emitting element OLED in response to a third scan signal Scan3. In the embodiment, the second reset circuit 70 is set, so before the light emission stage, the cathode of the light-emitting element OLED can be initialized by using the second reset signal Vref2, which can eliminate the residual charges of the light-emitting element OLED in the previous frame and is conducive to improving the contrast. Exemplarily, the second reset signal Vref2 may be a direct current voltage signal with a low potential.

For example, the second reset circuit 70 may include a sixth transistor M6, a gate of the sixth transistor M6 is connected to a third scan line to access a third scan signal Scan3, a first electrode of the sixth transistor M6 is connected to the cathode of the light-emitting element OLED, and a second electrode of the sixth transistor OLED is connected to a second reset signal line to assess the second reset signal Vref2. In the embodiment, the second reset circuit 70 includes one transistor so that the second reset circuit 70 has a simple structure and is easy to implement.

Referring to FIG. 5, exemplarily, multiple transistors in the pixel circuit may all be N-type transistors, forming an all-N-type pixel circuit. On the basis of the low leakage current of N-type transistors, the display uniformity of the display panel can be improved, so the pixel circuit is particularly suitable for medium/large-sized products, and low-frequency display of the display panel is facilitated.

Figure 6:
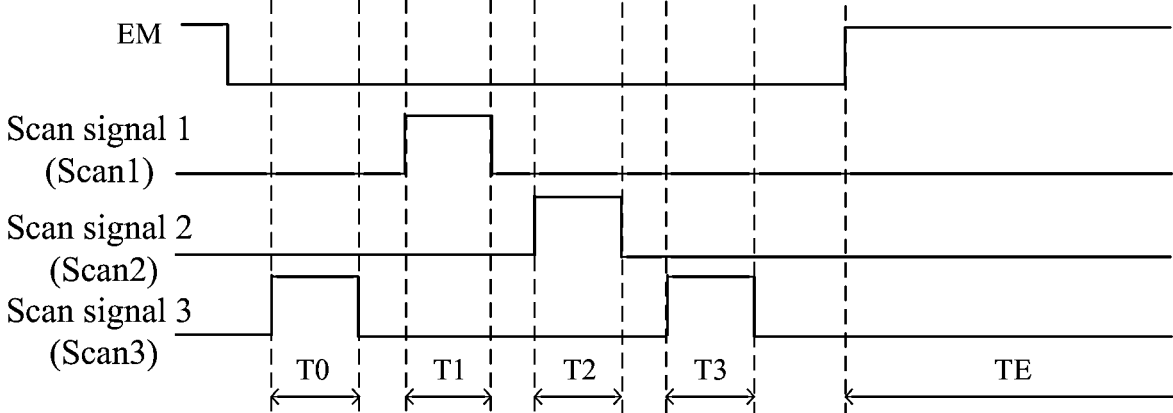
FIG. 6 is a drive timing diagram of another pixel circuit according to an embodiment of the present application.

FIG. 6 is a drive timing diagram of another pixel circuit according to an embodiment of the present application. Referring to FIG. 5 and FIG. 6, an example where the pixel circuit is an all-N-type pixel circuit is illustrated. The driving process of the pixel circuit may include a cathode reset stage T0, a gate reset stage T1, a data write stage T2, a cathode pre-charging stage T3 and a light emission stage TE.

In the cathode reset stage T0, the third scan signal Scan3 is at a high potential, and the first scan signal Scan1, the second scan signal Scan2 and the light emission control signal EM are each at a low potential. The sixth transistor M6 is turned on, and the second reset signal Vref2 is transmitted to the cathode of the light-emitting element OLED through the sixth transistor M6 to reset the cathode of the light-emitting element OLED, which can eliminate the residual charges in the previous frame and is conducive to improving the contrast. At the same time, the gate of the drive transistor DTFT maintains the potential of the previous frame, so the drive transistor DTFT remains turned-on in this stage. The second reset signal Vref2 is transmitted to the second electrode of the drive transistor DTFT through the sixth transistor M6 and then transmitted to the first electrode of the drive transistor DTFT through the drive transistor DTFT to reset the first electrode and the second electrode of the drive transistor DTFT, which is conducive to correcting the threshold voltage drift of the drive transistor DTFT and thus improving the phenomenon of low brightness in the first frame during grayscale changes.

In the gate reset stage T1, the first scan signal Scan1 is at a high potential, and the second scan signal Scan2, the third scan signal Scan3 and the light emission control signal EM are each at a low potential. The first transistor M1 is turned on, the first reset signal Vref1 is transmitted to the gate of the drive transistor DTFT through the first transistor M1 to reset the gate of the drive transistor DTFT, so the gate of the drive transistor DTFT is changed to a high potential.

In the data write stage T2, the second scan signal Scan2 is at a high potential, and the first scan signal Scan1, the third scan signal Scan3 and the light emission control signal EM are each at a low potential. The second transistor M2 and the third transistor M3 are turned on, and the data voltage Data is transmitted to the gate of the drive transistor DTFT through the second transistor M2, the first electrode and the second electrode of the drive transistor DTFT and the third transistor M3. During the data writing process, the gate potential Vg of the drive transistor DTFT continuously decreases from the high potential of the first reset signal Vref1 until the potential difference Vgs between the gate and the first electrode of the drive transistor DTFT satisfies that Vgs=Vth, and then the drive transistor DTFT is turned off. At this time, the gate potential of the drive transistor DTFT is no longer changed and kept at Vg satisfying that Vg=Data+Vth, where Vth is the threshold voltage of the drive the transistor DTFT.

In the cathode pre-charging stage T3, the third scan signal Scan3 is at a high potential, and the first scan signal Scan1, the second scan signal Scan2 and the light emission control signal EM are each at a low potential. The sixth transistor M6 is turned on, and the second reset signal Vref2 passes through the sixth transistor M6 to pre-charge the cathode of the light-emitting element OLED so that the lighting speed of the light-emitting element OLED at low brightness is increased, flicker caused by too slow lighting process from the low brightness due to the low migration rate of the IGZO drive transistor is reduced, and also the non-uniform display phenomenon at low brightness is improved.

In the light emission stage TE, the light emission control signal EM is at a high potential, and the first scan signal Scan1, the second scan signal Scan2 and the third scan signal Scan3 are each at a low potential. The fourth transistor M4 and the fifth transistor M5 are each turned on, and the drive transistor DTFT generates a drive current to drive the light-emitting element OLED to emit light. In this stage, based on the storage effect of the capacitor Cst, the gate potential Vg of the drive transistor DTFT is kept at Data+Vth, and the potential Vs at the first electrode of the drive transistor DTFT satisfies that Vs=ELVSS. Therefore, the potential difference Vgs between the gate and the first electrode of the drive transistor satisfies that Vgs=Vg-Vs-Data+Vth-ELVSS. The drive transistor works in the saturation region, and the formula of the current of the saturation region is that $$Ids = \frac{1}{2}\frac{W}{L}\mu Cox(Vgs - Vth)^2 =$$
$$\frac{1}{2}\frac{W}{L}\mu Cox(\text{Data} + Vth - ELVSS - Vth)^2 = \frac{1}{2}\frac{W}{L}\mu Cox(\text{Data} - ELVSS)^2,$$

where Ids donates the drive current, W and L donate the channel width and the channel length of the drive transistor DTFT respectively, μ donates electron mobility, and Cox donates channel capacitance per unit area. The channel width W, the channel length L, the electron mobility μ and the channel capacitance Cox per unit area may all be considered constants. Therefore, the drive current Ids is not related to the threshold voltage Vth of the drive transistor DTFT, but only to the data voltage Data and the second power supply signal ELVSS. In this manner, the effect of compensating for the non-uniform threshold voltage of the drive transistor DTFT is achieved.

According to the pixel circuit provided in the embodiments of the present application, the light-emitting element OLED is disposed between two light emission control circuits, for example, between the first light emission control circuit 40 and the drive circuit 10. Therefore, in the time period when the light emission control signal EM is at a low potential, the two light emission control circuits are both turned off, so the source of the power supply of the light-emitting element OLED can be cut off, and thus the light-emitting element OLED can be controlled to be completely extinguished. In this manner, the phenomenon of undesired light emission of the light-emitting element OLED caused by current leakage of the sixth transistor M6 and other reasons can be effectively avoided Moreover, the range of the initialization voltage (that is, the second reset signal Vref2) at the cathode of the light-emitting element OLED can be significantly expanded, so the second reset signal Vref2 can provide a sufficiently low potential to the cathode of the light-emitting element OLED without the need for worrying about that the light-emitting element OLED cannot be turned off under a black image. On this basis, the cathode reset stage TO is set, so the state of the drive transistor DTFT can be completely reset before data writing, which is conducive to reducing situations of low brightness in the first frame, low-frequency flicker and frequency switching flicker; moreover, the cathode potential of the light-emitting element OLED is reset, so the residual charges of the cathode of the light-emitting element OLED from the previous frame are eliminated, and the contrast is improved. In addition, the cathode pre-charging stage T3 is set, so the cathode of the light-emitting element OLED can be pre-charged before light emission; especially in a low brightness interval, the cathode of the light-emitting element OLED may be charged to a relatively low potential in advance, so the lighting speed of the light-emitting element OLED is improved, the low-frequency flicker caused by the slow lighting speed of the light-emitting element OLED due to the relatively low migration rate of the IGZO drive transistor is reduced, and the phenomenon of the non-uniform brightness caused by the non-uniform lighting speed in the low brightness interval is reduced.

In the preceding embodiments, the circuit connection relationship and the working principle of the pixel circuit are illustrated in conjunction with a specific pixel circuit, and the film layer structure of the pixel circuit is specifically illustrated below.

Figure 7:
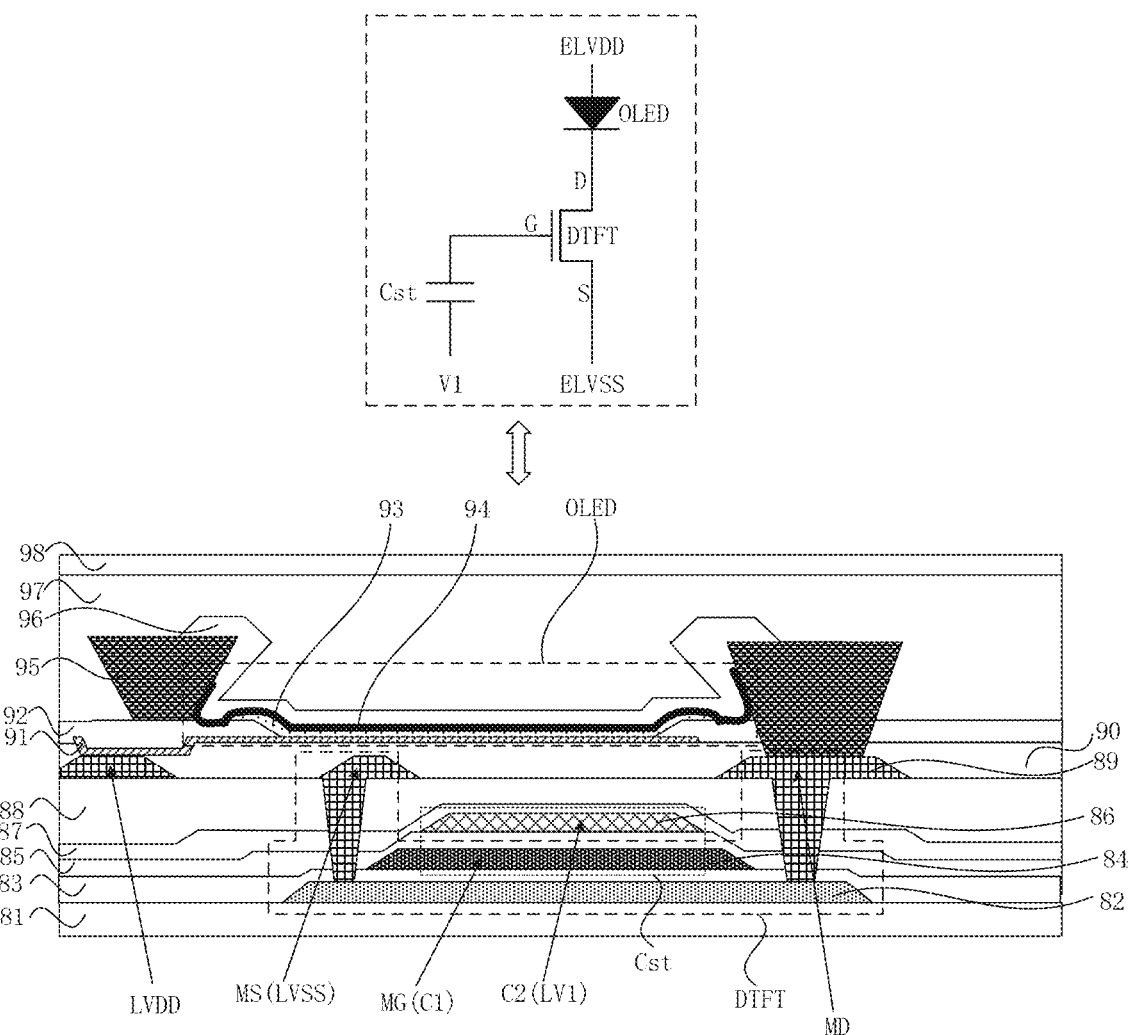
FIG. 7 is a structural view of film layers of a pixel circuit according to an embodiment of the present application.

FIG. 7 is a structural view of film layers of a pixel circuit according to an embodiment of the present application. FIG. 7 shows a specific setting manner of a pixel circuit in film layers of the display panel; FIG. 7 mainly shows the series connection structure of the drive transistor DTFT and the light-emitting element OLED between the positive voltage power supply and the negative voltage power supply, and omits the structures of the fourth transistor M4 and the fifth transistor M5; FIG. 7 shows the structure of the capacitor Cst.

Referring to FIG. 7, exemplarily, the display panel includes an active layer 82, a gate insulating layer 83, a first metal layer 84, a capacitor middle medium layer 85, a second metal layer 86, an interlayer insulating layer 87, an organic insulating layer 88, a third metal layer 89, a planarization layer 90, an anode layer, a light emission function layer, a cathode layer, a first inorganic encapsulation layer 96, an organic encapsulation layer 97 and a second inorganic encapsulation layer 98 which are laminated. The anode 91 of the light-emitting element OLED is disposed in the anode layer, a light emission function-related film layer 93 is disposed in the light emission function layer, and the cathode 94 is disposed in the cathode layer. Anodes 91 of multiple light-emitting elements OLED are separated by a pixel defining layer 92. Light emission function-related film layers 93 of the multiple light-emitting elements OLED are separated by isolating structures 95, and cathodes 94 of the multiple light-emitting elements OLED are also separated by isolating structures 95.

The substrate 81 is configured to support multiple film layers above and may be prepared using organic materials, such as polyimide (PI), or inorganic materials, such as glass. The active layer 82 is configured to form the channel portion and the source region and the drain region of the transistor in the pixel circuit. The material of the active layer 82 may be, for example, a-Si, P-Si, IGZO, etc., as long as p-n junctions can be formed; the specific material is not limited. The gate insulating layer 83 is configured to isolate the active layer 82 and the first metal layer 84, and may be made of inorganic materials such as silicon nitride and silicon oxide. The capacitor middle medium layer 85 is configured to isolate the first metal layer 84 and the second metal layer 86, and may be made of materials such as silicon nitride. The interlayer insulating layer 87 and the organic insulating layer 88 are both configured to isolate the second metal layer 86 and the third metal layer 89. The interlayer insulating layer 87 may include silicon nitride and silicon oxide which are laminated. The planarization layer 90 is configured to isolate the third metal layer 89 and the anode layer and planarize the surface film layer at the same time, so as to flatten subsequent film layers of the light-emitting element OLED and optimize the light output by pixels. The planarization layer 90 may be prepared by organic materials. The material of the metal layers may be metal materials such as molybdenum and titanium aluminum titanium. The pixel defining layer 92 is configured to define the size of the pixel opening and may be prepared by inorganic materials. The first inorganic encapsulation layer 96, the organic encapsulation layer 97 (for example, an inkjet printing layer) and the second inorganic encapsulation layer 98 are configured to compose encapsulation film layers of the display panel.

The isolating structure 95 may be prepared on a side of the pixel defining layer 92 away from the substrate 81 before the evaporation of the light emission function layer. The isolating structure 95 corresponding to the light-emitting element OLED may be disposed around the pixel opening corresponding to the light-emitting element OLED. The isolating structure 95 has a certain height, so when the light emission function layer and the cathode layer are evaporated, the protruding isolating structure 95 is used for separating light emission function-related film layers 93 between different light-emitting elements OLED and disconnecting the electrical connection between cathodes 94 of adjacent light-emitting elements OLED, ensuring that cathodes potentials of multiple light-emitting elements OLED can be controlled individually. Exemplarily, the isolating structure 95 may be of a structure that is wide at the top and narrow at the bottom; for example, the shape of the section of the isolating structure 95 may be an inverted trapezoid, so as to ensure that cathodes 94 of adjacent light-emitting elements OLED are disconnected when the cathode layer is prepared.

Arrangement manners of main components of the pixel circuit involved in the dashed box with some components omitted and arrangement manners of multiple signal lines of in multiple film layers of the display panel are illustrated below in conjunction with FIG. 7. The structures of the fourth transistor M4 and the fifth transistor M5 are omitted in FIG. 7. In actual preparation, the first electrode MS of the drive transistor DTFT may be connected to the second power supply signal line LVSS through the fifth transistor M5. The second electrode MD of the drive transistor DTFT may be directly connected to the cathode 94 of the light-emitting element OLED, or connected to the cathode 94 of the light-emitting element OLED through the fourth transistor M4.

In an embodiment, for example, the channel region, the source region and the drain region of the drive transistor DTFT are all disposed in the active layer 82, the gate MG of the drive transistor DTFT is disposed in the first metal layer 84, and the projection of the gate MG of the drive transistor DTFT in the thickness direction of the display panel covers the channel region of the drive transistor DTFT. The first electrode MS and the second electrode MD of the drive transistor DTFT are both disposed in the third metal layer 89. Projections of the first electrode MS and the second electrode MD of the drive transistor in the thickness direction of the display panel cover the source region and the drain region of the drive transistor DTFT respectively. The first electrode MS and the second electrode MD of the drive transistor may be connected to the source region and the drain region of the drive transistor DTFT, respectively, through via holes.

The fixed potential signal is provided by the fixed potential signal line LV1. The fixed potential signal line LV1 may be disposed in the second metal layer 86 as shown in FIG. 7, or may be disposed in other conductive film layers, such as the third metal layer 89. The projection of the fixed potential signal line LV1 in the thickness direction of the display panel at least partially overlaps the gate MG of the drive transistor DTFT. The gate MG of the drive transistor DTFT may also serve as a first electrode plate C1 of the capacitor Cst, which is equivalent to achieving the connection between the first terminal of the capacitor Cst and the gate MG of the drive transistor DTFT. The overlap between the fixed potential signal line LV1 and the gate MG of the drive transistor DTFT may also serve as a second electrode plate C2 of the capacitor Cst, which is equivalent to achieving the connection between the second terminal of the capacitor Cst and the fixed potential signal line LV1. The first electrode plate C1 and the second electrode plate C2 are facing each other to form the capacitor Cst, and the facing area between the first electrode plate C1 and the second electrode plate C2 may be disposed according to actual requirements.

The isolating structure 95 may include a conductive material layer, the cathode 94 of the light-emitting element OLED is in contact with the isolating structure 95 and is electrically connected to the corresponding pixel circuit, for example, connected to the second electrode MD of the drive transistor DTFT, through the isolating structure 95. Pixel circuits and light-emitting elements OLED may each be arranged in an array in the display panel. When the isolating structure 95 includes the conductive material layer, it may be set that each light-emitting element OLED is surrounded by an isolating structure 95 peripherally. Therefore, two adjacent light-emitting elements OLED can be isolated by two isolating structures 95. Two isolating structures 95 are insulated from each other, for example, two isolating structures 95 are isolated through the organic encapsulation layer 97, so the electrical connection between cathodes 94 of adjacent light-emitting elements OLED can be reliably disconnected. Before the isolating structure 95 is prepared, through holes may be prepared in the pixel defining layer 92 and the planarization layer 90 for exposing the surface of the second electrode MD of the drive transistor DTFT, so as to achieve electrical connection between the isolating structure 95 and the second electrode MD of the drive transistor DTFT; then, the isolating structure 95 is prepared on the pixel defining layer 92. The upper surface of the isolating structure 95 may be a surface that is flush everywhere. Alternatively, the height of a portion of the isolating structure 95 at the region of the through hole may be lower than the height of other regions, as long as the isolating structure 95 can cut off cathodes 94 of adjacent light-emitting elements OLED. The height difference generated by the top surface of the isolating structure 95 may be filled in by the organic encapsulation layer 97. Moreover, the shape of the section of the isolating structure 95 may be understood as the shape of the section of the part of the isolating structure 95 located above the through hole. The shape of the section does not include the through hole itself. The shape and the size of the through hole itself may be freely set according to the preparation process and actual requirements.

With continued reference to FIG. 7, exemplarily, the positive voltage power supply is connected to the pixel circuit, for the example, connected to the anode 91 of the light-emitting element OLED, through the first power supply signal line LVDD. The first power supply signal line LVDD may be disposed in a conductive film layer located below the light emission function layer, for example, in the second metal layer 86, the third metal layer 89 or the anode layer. FIG. 7 shows an example where the first power supply signal line LVDD is disposed in the third metal layer 89. Moreover, the negative voltage power supply is connected to the pixel circuit, for example, connected to the first electrode MS of the drive transistor DTFT, through the second power supply signal line LVSS. The second power supply signal line LVSS may be disposed in a conductive film layer located below the light emission function layer, for example, in the second metal layer 86, the third metal layer 89 or the anode layer. FIG. 7 shows an example where the second power supply signal line LVSS is disposed in the third metal layer 89. Moreover, the overlap between the second power supply signal line LVSS and the source region of the drive transistor DTFT may also serve as the first electrode MS of the drive transistor DTFT.

On the basis of the film layer structures in FIG. 7, starting from the first power supply signal line LVDD, the current may sequentially pass through the following path: the first power supply signal line LVDD, the anode 91 of the light-emitting element OLED, the light emission function layer 93 of the light-emitting element OLED, the cathode 94 of the light-emitting element OLED, the isolating structure 95, the second electrode MD of the drive transistor DTFT, the channel region of the drive transistor DTFT, the first electrode MS of the drive transistor DTFT and the second power supply signal line LVSS.

In summary, it can be seen that in the pixel circuit provided in the embodiments of the present application, cathodes 94 of multiple light-emitting elements OLED are separated by isolating structures 95 that are wide at the top and narrow at the bottom, so it can be ensured that potentials at the cathodes 94 of the multiple light-emitting elements OLED can be controlled individually. Moreover, the cathode 94 of the light-emitting element OLED is connected to the second electrode MD of the N-type drive transistor DTFT through the isolating structure 95, the first electrode MS of the drive transistor DTFT is connected to the second power supply signal line LVSS, and the gate MG of the drive transistor DTFT is connected to the capacitor Cst, so it can be ensured that the potential difference Vgs (that is, the gate-source voltage difference) between the gate and the first electrode of the drive transistor DTFT in the light emission stage is kept unchanged, and thus the light emission current is kept unchanged. In addition, cathodes 94 of multiple light-emitting elements OLED are separated, so the cathode 94 of each light-emitting element OLED only carries the current of a single pixel circuit. The main current of the entire panel is carried by two power supply signal wires, that is, the first power supply signal line LVDD and the second power supply signal line LVSS. The first power supply signal line LVDD and the second power supply signal line LVSS are each a metal wire disposed below the light emission function layer, having no obstruction to the light-emitting surface of the light-emitting element OLED; the transparency of the two power supply signal wires does not affect the light emission of the light-emitting element OLED. Therefore, compared with the entire-surface transparent cathode structure in the related art, the film layer structures provided in the embodiments of the present application make the material of the two power supply signal lines not limited by the transparency, and materials with lower resistance can be selected according to requirements for preparing the two power supply signal lines, so the voltage drop (IR drop) on the power supply signal lines can be reduced, and power consumption can be reduced.

On the basis of the preceding embodiments, for example, film layer structures of multiple transistors not shown in FIG. 7 may be arranged as below.

The active layer 82 may further include channel regions, source regions and drain regions of the first transistor M1 to the sixth transistor M6. The first metal layer 84 may further include the first scan line, the second scan line, the third scan line and the light emission control signal line. The overlap between multiple scan lines and the active layer 82 and the overlap between the light emission control signal line and the active layer 82 form the corresponding transistors. Multiple scan lines and the light emission control signal line also serve as gates of multiple transistors. The portion of the active layer 82 covered with the scan line or the light emission control signal line is the channel region of the transistor, and two sides of the channel region are the source region and the drain region respectively. The source region of the transistor corresponding to the first electrode of the transistor, and the drain region of the transistor corresponding to the second electrode of the transistor; or the source region of the transistor corresponding to the second electrode, and the drain region of the transistor corresponding to the first electrode. The second metal layer 86 may further include the first reset signal line and the second reset signal line. The third metal layer 89 may further include the data line.

The preceding embodiments provide a detailed explanation of the structure and the working process of the all-N-type pixel circuit based on the pixel circuit in FIG. 5, but do not serve as a limitation of the present application. In other embodiments, the pixel circuit may also have other circuit structures, and correspondingly, may also have other film layer structures. Several adjustment manners for the pixel circuit in preceding embodiments are described below.

Figure 8:
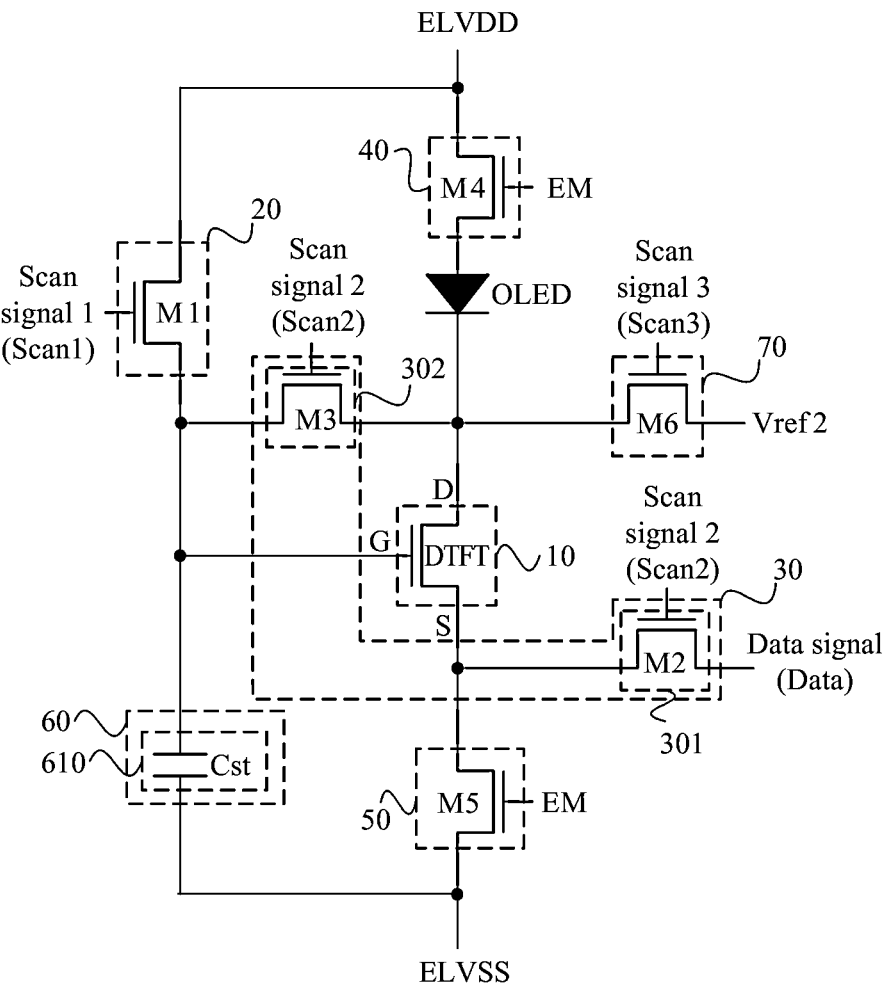
FIG. 8 is a structural diagram of another pixel circuit according to an embodiment of the present application.

FIG. 8 is a structural diagram of another pixel circuit according to an embodiment of the present application. Referring to FIG. 8, in an embodiment, for example, the first power supply signal ELVDD may also serve as the first reset signal Vref1. Correspondingly, the first power supply signal line LVDD may also serve as the first reset signal line, so it is not necessary to individually set the first reset signal line in the film layer structure.

The first power supply signal ELVDD and the first reset signal Vref1 are each a high potential signal. When the first power supply signal ELVDD and the first reset signal Vref1 are transmitted through different signal lines, the first reset signal Vref1 may be provided by an individual power supply. Therefore, the first reset signal Vref1 has an adjustable voltage, so the gate potential of the drive transistor DTFT can be provided according to requirements during the gate reset stage, which is conducive to optimizing the display effect of the product. When the first power supply signal ELVDD also serves as the first reset signal Vref1, the number of signal lines in the display panel can be reduced, which is conducive to reducing the space required for the wiring of the pixel design, promoting the design of the product with a high pixel density, and reducing the number of output channels required for the driver chip.

In the preceding embodiment, for example, at least one of the first power supply signal ELVDD, the second power supply signal ELVSS, the first reset signal Vref1 and the second reset signal Vref2 may also serve as the fixed potential signal V1. Correspondingly, at least one of the first power supply signal line LVDD, the second power supply signal line LVSS, the first reset signal line and the second reset signal line may also serve as the fixed potential signal line LV1. Therefore, it is not necessary to individually set the fixed potential signal line LV1 in the display panel, which is conducive to reducing the space required for the wiring of the pixel design. When another signal line also serves as the fixed potential signal line LV1, the second electrode plate C2 of the capacitor Cst may be individually disposed at the position facing the gate MG of the drive transistor DTFT in the second metal layer 86, and the second electrode plate C2 is connected to the corresponding signal line through via holes or jumpers. Exemplarily, as shown in FIG. 8, the second power supply signal ELVSS may also serve as the fixed potential signal V1.

Figures 9, 10:
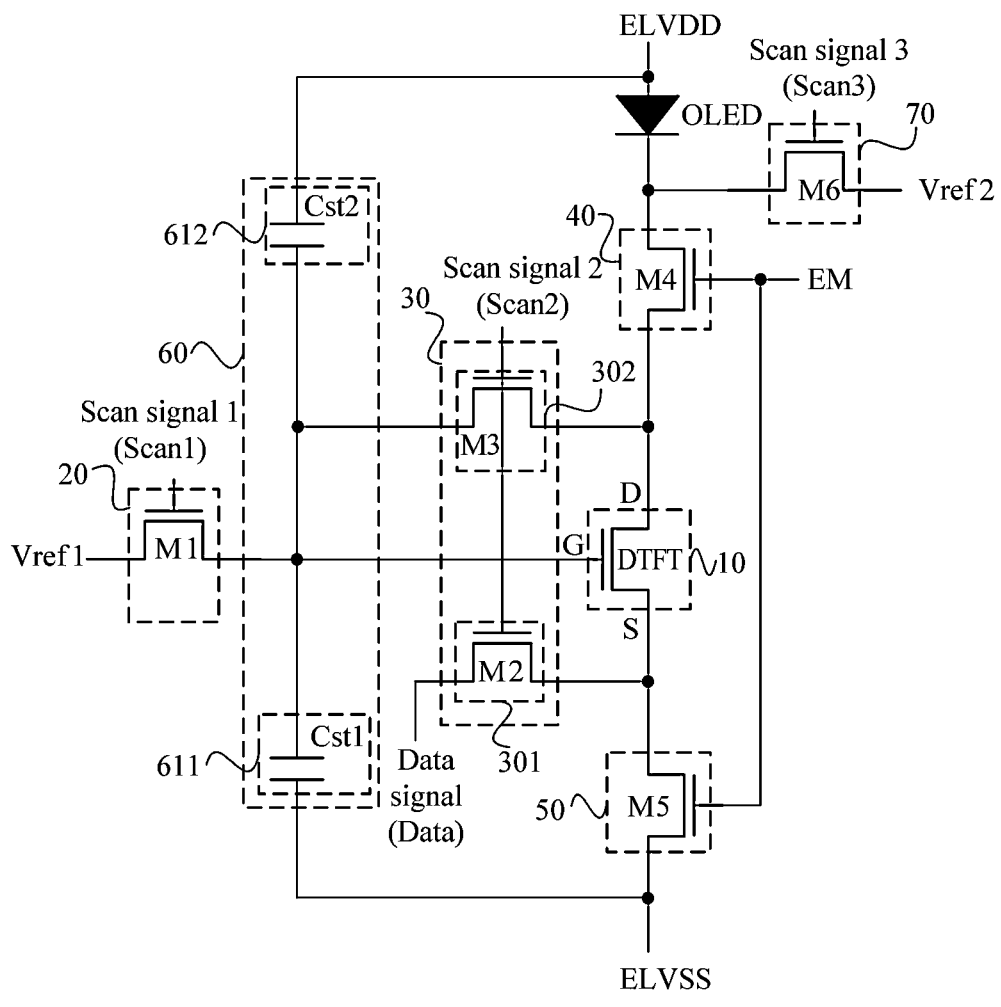
FIG. 9 is a structural diagram of another pixel circuit according to an embodiment of the present application.
FIG. 10 is a drive timing diagram of another pixel circuit according to an embodiment of the present application.

The preceding embodiments exemplify the case where the storage circuit 60 accesses a fixed potential signal and includes a storage unit 610, but do not limit the present application. In other embodiments, for example, as shown in FIG. 9, it may be set that the storage circuit 60 includes at least two storage units (an example where the storage circuit 60 includes two storage units is illustrated here). First terminals of multiple storage units are each connected to the control terminal G of the drive circuit 10, and second terminals of the multiple storage units access different fixed potential signals respectively. For example, as shown in FIG. 9, it may be set that a first storage unit 611 includes a first capacitor Cst1, and a second terminal of the first storage unit 611 may assess the second power supply signal ELVSS; a second storage unit 612 includes a second capacitor Cst2, and a second terminal of the second storage unit 612 may access the first power supply signal ELVDD. In the embodiment, the storage circuit 60 includes multiple storage units, and the multiple storage units are connected to multiple fixed potential signals, which is conducive to flexibly achieving the design of larger capacitance to improve the potential keeping capacity of the storage circuit 60.

The preceding embodiment exemplifies the structure where the first terminal of the first light emission control circuit 40 is connected to the positive voltage power supply, and the cathode of the light-emitting element OLED is connected to the drive circuit 10, but does not limit the present application. In other embodiments, for example, as shown in FIG. 9, it may be set that the anode of the light-emitting element OLED is connected to the positive voltage power supply, the cathode of the light-emitting element OLED is connected to the first terminal of the first light emission control circuit 40, and the second terminal of the first light emission control circuit 40 is connected to the second terminal D of the drive circuit 10. The second reset circuit 70 is still electrically connected to the cathode of the light-emitting element OLED.

FIG. 10 is a drive timing diagram of another pixel circuit according to an embodiment of the present application. The pixel circuit shown in FIG. 9 may be driven using the drive timing shown in FIG. 10. Referring to FIG. 9 and FIG. 10, the driving process of the pixel circuit includes a gate reset stage T1, a data write stage T2 and a light emission stage TE.

In the gate reset stage T1, the first scan signal Scan1 is at a high potential, and the second scan signal Scan2, the third scan signal Scan3 and the light emission control signal EM are each at a low potential. The first transistor M1 is turned on, and the first reset signal Vref1 is transmitted to the gate of the drive transistor DTFT through the first transistor M1, resetting the gate of the drive transistor DTFT.

In the data write stage T2, the second scan signal Scan2 and the third scan signal Scan3 are each at a high potential, and the first scan signal Scan1 and the light emission control signal EM are each at a low potential signal. The second transistor M2 and the third transistor M3 are turned on, and the data voltage Data is transmitted to the gate of the drive transistor DTFT through the second transistor M2, the first electrode and the second electrode of the drive transistor DTFT and the third transistor M3. Moreover, the sixth transistor M6 is turned on, and the second reset signal Vref2 resets the cathode of the light-emitting element OLED through the sixth transistor M6.

In the light emission stage TE, the light emission control signal EM is at a high potential, and the first scan signal Scan1, the second scan signal Scan2 and the third scan signal Scan3 are each at a low potential. The fourth transistor M4 and the fifth transistor M5 are each turned on, and the drive transistor DTFT generates a drive current to drive the light-emitting element OLED to emit light.

In the drive timing shown in FIG. 10, the pulses of the third scan signal Scan3 and the second scan signal Scan2 overlap, that is, the cathode reset process of the light-emitting element OLED and the data writing process of the drive transistor DTFT are performed simultaneously. However, the preceding timing does not limit the present application. In other embodiments, for example, before the light emission stage TE, the first light emission control circuit 40 remains turned off, and thus the potential of the second reset signal Vref2 will not be transmitted to the second electrode of the drive transistor DTFT. Therefore, the cathode reset stage of the light-emitting element OLED may be performed at any time during the time period when the light emission control signal EM is at a low potential; for example, the cathode reset stage may be performed simultaneously with the gate reset stage T1.

Figure 11:
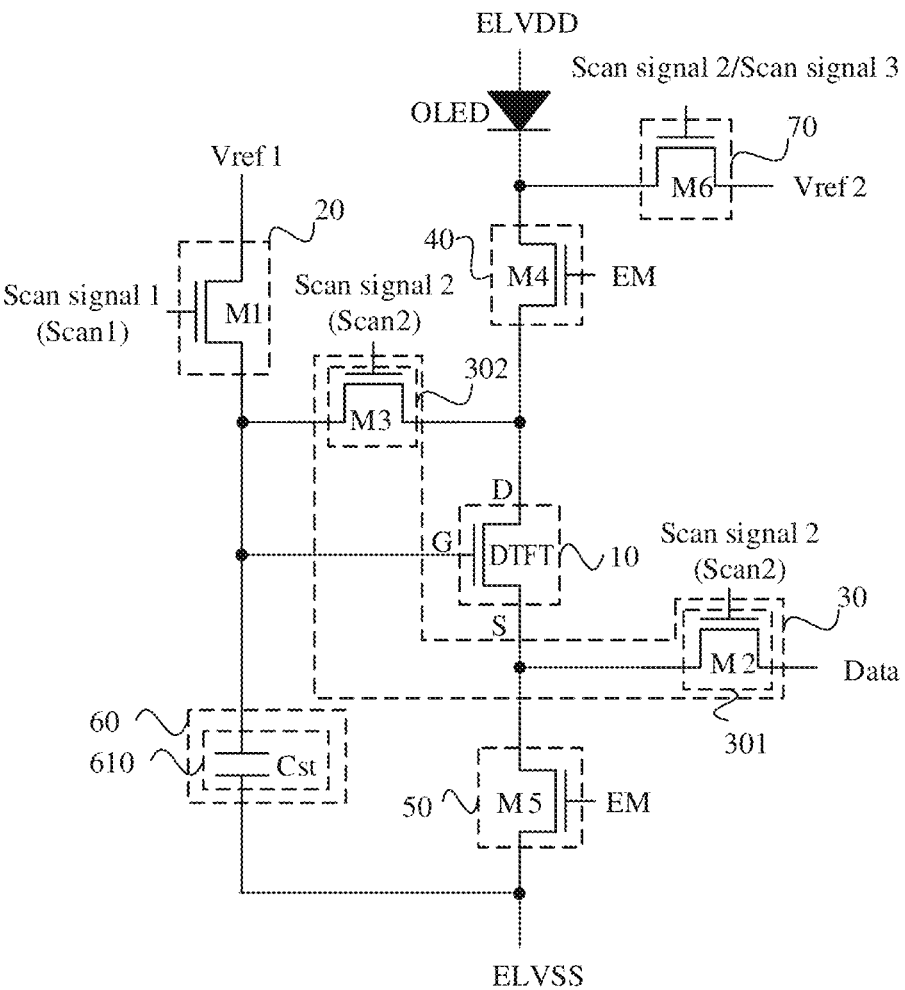
FIG. 11 is a structural diagram of another pixel circuit according to an embodiment of the present application.

FIG. 11 is a structural diagram of another pixel circuit according to an embodiment of the present application. Referring to FIG. 11, on the basis of the preceding embodiments, for example, it may be set that the second scan signal Scan2 also serves as the third scan signal Scan3 so that the wiring of the display panel is simplified. The pixel circuit may still use the drive timing shown in FIG. 4. Alternatively, it may be set that the first scan signal Scan1 also serves as the third scan signal Scan3 so that the wiring of the display panel is simplified. Then, the pixel circuit may still use the drive timing shown in FIG. 4.

In summary, the embodiments of the present application provide a pixel driver circuit having all-N-type transistors applicable to the case where cathodes of multiple light-emitting elements OLED are isolated and potentials at the cathodes can be controlled individually. To verify the improvement effect of the pixel circuit on the display uniformity, the applicant simulates the pixel circuit structure in the related art shown in FIG. 1 and the pixel circuit structure provided in the embodiments of the present application in FIG. 8, and collects the variation of potentials of key nodes in the pixel circuit during the light emission process. For simulation results, reference may be made to FIG. 12 and FIG. 13.

Figure 12:
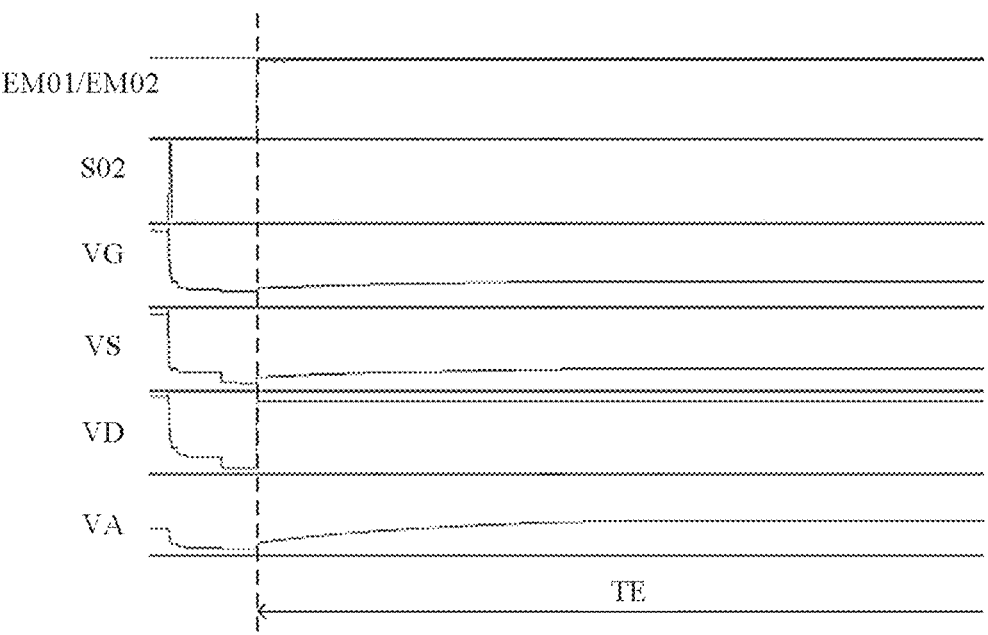
FIG. 12 is a simulation oscillogram of a driving process of a pixel circuit in the related art.

Referring to FIG. 12, when the pixel circuit in the related art is simulated, the gate potential VG, the first electrode potential VS and the second electrode potential VD of the drive transistor are separately collected, and the anode potential VA of the light-emitting element is also collected. It can be seen from the simulation result in FIG. 12 that since capacitance coupling is used for potential keeping in the related art, the gate potential VG and the first electrode potential VS of the drive transistor DTFT synchronously rise for a long time after the start of the light emission stage TE. For a long time after the start of the light emission stage TE, the gate potential VG and the first electrode potential VS of the drive transistor DTFT continuously change. Although the capacitance coupling keeps the voltage difference Vgs as constant as possible, the voltage difference still cannot be completely stabilized.

Figure 13:
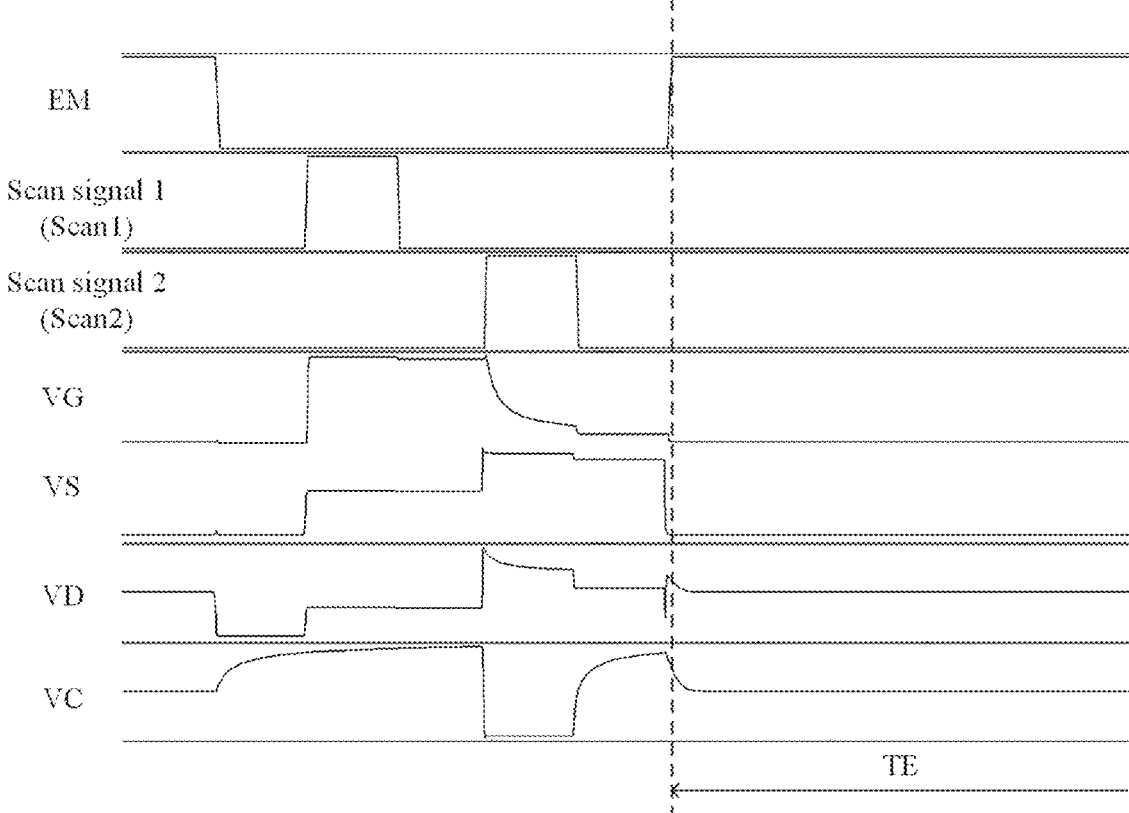
FIG. 13 is a simulation oscillogram of a driving process of a pixel circuit according to an embodiment of the present application.

Referring to FIG. 13, when the pixel circuit provided in the embodiments of the present application is simulated, the gate potential VG, the first electrode potential VS and the second electrode potential VD of the drive transistor are separately collected, and the cathode potential VC of the light-emitting element is also collected. It can be seen from the simulation result in FIG. 13 that since the light emission stage TE, the gate potential VG and the first electrode potential VS of the drive transistor DTFT are kept fixed and unchanged. Therefore, the pixel circuit provided in the embodiments of the present application can reliably maintain the gate potential VG and the first electrode potential VS of the drive transistor DTFT.

Figure 14:
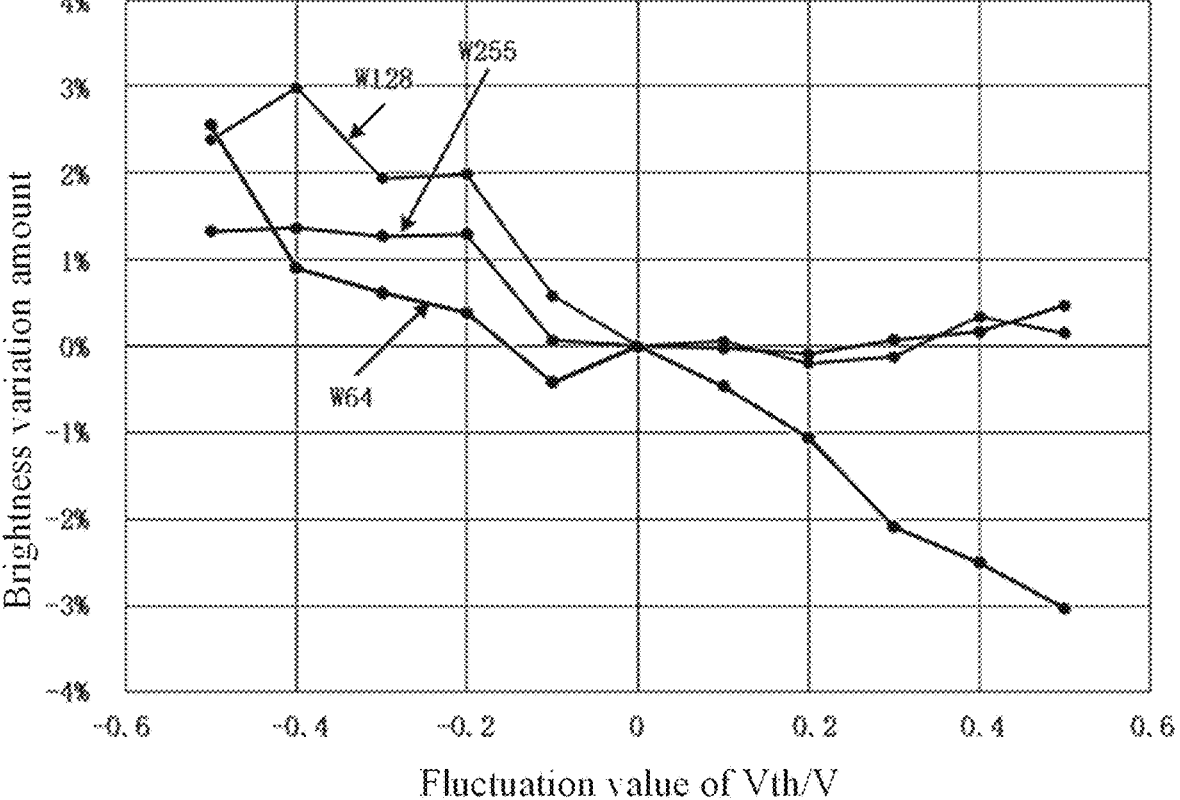
FIG. 14 is a graph showing brightness variation amounts of a pixel circuit under the fluctuation of the threshold voltage of a drive transistor according to an embodiment of the present application.

Referring to FIG. 14, to verify the compensation effect of the pixel circuit provided in the embodiments of the present application on the non-uniform threshold voltage of the drive transistor DTFT, the applicant also simulates percentages of brightness variations when the threshold voltage Vth of the drive transistor DTFT fluctuates by +0.5V under grayscale images of W255, W128 and W64 based on the pixel circuit provided in the embodiments of the present application. It can be seen that even in the case of the grayscale images of W64 and the Vth fluctuates by ±0.5V, the pixel circuit structure can ensure that the brightness variation is only within 3%, indicating that the pixel circuit can effectively compensate for the non-uniform threshold voltage Vth of the drive transistor DTFT, and can reliably improve the display uniformity of the display panel.

An embodiment of the present application further provides a display panel. The display panel includes multiple pixel circuits provided in any embodiment of the present application and has corresponding beneficial effects. Exemplarily, the multiple pixel circuits may be arranged in an array in a display region of the display panel. The scan signal and the light emission control signal required by the pixel circuit may be provided by a corresponding gate driver circuit disposed in a non-display region of the display panel through corresponding signal lines. The data voltage required by the pixel circuit may be provided by a driver chip through a data line.

In the embodiments of the pixel circuit, specific explanations are provided for film layer structures of different pixel circuits in the display panel. These film layer structures may all be considered as the film layer structures of the display panel provided in the embodiments of the present application, and repeated content is not described here.

For example, the display panel may include an active layer, a first metal layer, a second metal layer, a third metal layer, an anode layer, a light emission function layer and a cathode layer which are laminated. A channel region of the drive transistor, a source region of the drive transistor and a drain region of the drive transistor are all disposed in the active layer; a gate of the drive transistor is disposed in the first metal layer, and the projection of the gate of the drive transistor in the thickness direction of the display panel covers the channel region of the drive transistor; and a first electrode of the drive transistor and a second electrode of the drive transistor are both disposed in the third metal layer, and the first electrode and the second electrode of the drive transistor are connected to the source region and the drain region of the drive transistor respectively. A fixed potential signal is provided by a fixed potential signal line, the fixed potential signal line is disposed in the second metal layer or the third metal layer, and the projection of the fixed potential signal line in the thickness direction of the display panel at least partially overlaps the gate of the drive transistor; the overlap between the fixed potential signal line and the gate of the drive transistor forms a storage circuit. A positive voltage power supply is connected to the pixel circuit through a first power supply signal line, a negative voltage power supply is connected to the pixel circuit through a second power supply signal line The first power supply signal line and the second power supply signal line may both be disposed in a conductive film layer below the light emission function layer, for example, disposed in the second metal layer, the third metal layer or the anode layer. The display panel further includes multiple isolating structures disposed around the multiple light-emitting elements, where the isolating structures are configured to isolate cathodes of adjacent light-emitting elements. Exemplarily, an isolating structure may include a conductive material layer, a cathode of a light-emitting element is in contact with the isolating structure, and the cathode of the light-emitting element is connected to a corresponding pixel circuit through the isolating structure. The shape of the section of the isolating structure may be an inverted trapezoid.

It is to be understood that various forms of processes shown above may be adopted with steps reordered, added or deleted. For example, the steps described in the present application may be performed in parallel, sequentially or in different sequences, as long as the desired results of the technical solutions of the present application can be achieved, and no limitation is imposed herein.

What is claimed is:

1. A pixel circuit, comprising:
   a drive circuit, wherein the drive circuit is configured to generate a drive current according to a potential at a control terminal of the drive circuit;
   a first reset circuit, wherein the first reset circuit is connected to the control terminal of the drive circuit and configured to transmit a first reset signal to the control terminal of the drive circuit in response to a first scan signal;
   a data write circuit, wherein the data write circuit is connected to the drive circuit and configured to transmit a data voltage to the drive circuit in response to a second scan signal;
   a first light emission control circuit, wherein the first light emission control circuit is connected in series with a light-emitting element between a positive voltage power supply and a second terminal of the drive circuit, and the first light emission control circuit is configured to be turned on in response to a light emission control signal so that a first power supply signal provided by the positive voltage power supply is transmitted through a cathode of the light-emitting element to the second terminal of the drive circuit;

a second light emission control circuit, wherein the second light emission control circuit is connected between a first terminal of the drive circuit and a negative voltage power supply and configured to be turned on in response to the light emission control signal;

a storage circuit, wherein the storage circuit is connected to the control terminal of the drive circuit and configured to store the potential at the control terminal of the drive circuit; and a second reset circuit electrically connected to the cathode of the light-emitting element, wherein the second reset circuit is configured to transmit a second reset signal to the cathode of the light-emitting element in response to a third scan signal, wherein a first terminal of the first light emission control circuit is connected to the positive voltage power supply, a second terminal of the first light emission control circuit is connected to an anode of the light-emitting element, and the cathode of the light-emitting element is connected to the second terminal of the drive circuit; the first reset circuit is configured to, in a gate reset stage, be turned on in response to the first scan signal and reset the control terminal of the drive circuit by using the first reset signal; the data write circuit is configured to, in a data write stage, be turned on in response to the second scan signal and transmit the data voltage to the drive circuit; the second reset circuit is configured to, in a cathode pre-charging stage, be turned on in response to the third scan signal and pre-charge the cathode of the light-emitting element by using the second reset signal; and the first light emission control circuit and the second light emission control circuit are configured to, in a light emission stage, be turned on in response to the light emission control signal so as to enable the drive circuit to generate the drive current according to the potential at the control terminal of the drive circuit and drive the light-emitting element to emit light.

2. The pixel circuit according to claim 1, wherein a first terminal of the first light emission control circuit is connected to the positive voltage power supply, a second terminal of the first light emission control circuit is connected to the anode of the light-emitting element, and the cathode of the light-emitting element is connected to the second terminal of the drive circuit.

3. The pixel circuit according to claim 1, wherein the storage circuit accesses a fixed potential signal; the storage circuit comprises a storage unit, a first terminal of the storage unit is connected to the control terminal of the drive circuit, and a second terminal of the storage unit accesses the fixed potential signal.

4. The pixel circuit according to claim 3, wherein the storage unit comprises a capacitor, wherein a first terminal of the capacitor serves as the first terminal of the storage unit, and a second terminal of the capacitor serves as the second terminal of the storage unit.

5. The pixel circuit according to claim 3, wherein at least one of the first power supply signal provided by the positive voltage power supply, a second power supply signal provided by the negative voltage power supply and the first reset signal also serves as the fixed potential signal.

6. The pixel circuit according to claim 1, wherein the drive circuit comprises a drive transistor, a gate of the drive transistor serves as the control terminal of the drive circuit, a first electrode of the drive transistor serves as the first terminal of the drive circuit, and a second electrode of the drive transistor serves as the second terminal of the drive circuit; the first reset circuit comprises a first transistor, a gate of the first transistor is connected to a first scan line, a first electrode of the first transistor is connected to the control terminal of the drive circuit, and a second electrode of the first transistor is connected to a first reset signal line;

the data write circuit comprises a data write unit and a threshold compensation unit, the data write unit is connected to the first terminal of the drive circuit and configured to be turned on in response to the second scan signal and transmit the data voltage to the first terminal of the drive circuit; the threshold compensation unit is connected between the control terminal of the drive circuit and the second terminal of the drive circuit and configured to be turned on in response to the second scan signal and perform threshold voltage compensation on the drive circuit; the data write unit comprises a second transistor, a gate of the second transistor is connected to a second scan line, a first electrode of the second transistor is connected to a data line, and a second electrode of the second transistor is connected to the first terminal of the drive circuit; the threshold compensation unit comprises a third transistor, a gate of the third transistor is connected to the second scan line, a first electrode of the third transistor is connected to the control terminal of the drive circuit, and a second electrode of the third transistor is connected to the second terminal of the drive circuit;

the first light emission control circuit comprises a fourth transistor, a gate of the fourth transistor is connected to a light emission control signal line, and the fourth transistor is connected in series with the light-emitting element between the positive voltage power supply and the second terminal of the drive circuit; and the second light emission control circuit comprises a fifth transistor, a gate of the fifth transistor is connected to the light emission control signal line, a first electrode of the fifth transistor is connected to the first terminal of the drive circuit, and a second electrode of the fifth transistor is connected to the negative voltage power supply.

7. The pixel circuit according to claim 6, wherein the first power supply signal provided by the positive voltage power supply further serves as the first reset signal.

8. The pixel circuit according to claim 6, wherein the second reset circuit comprises a sixth transistor, a gate of the sixth transistor is connected to a third scan line, a first electrode of the sixth transistor is connected to the cathode of the light-emitting element, and a second electrode of the sixth transistor is connected to a second reset signal line.

9. The pixel circuit according to claim 1, wherein the storage circuit accesses at least one fixed potential signal, and the second reset signal further serves as one of the at least one fixed potential signal.

10. The pixel circuit according to claim 1, wherein the second reset circuit is further configured to, before the gate reset stage, be turned on in response to the third scan signal and reset the cathode of the light-emitting element, the first terminal of the drive circuit and the second terminal of the drive circuit by using the second reset signal.

11. A display panel, comprising a plurality of pixel circuits, wherein each pixel circuit of the plurality of pixel circuits comprises:

a drive circuit, wherein the drive circuit is configured to generate a drive current according to a potential at a control terminal of the drive circuit;

a first reset circuit, wherein the first reset circuit is connected to the control terminal of the drive circuit and configured to transmit a first reset signal to the control terminal of the drive circuit in response to a first scan signal;

a data write circuit, wherein the data write circuit is connected to the drive circuit and configured to transmit a data voltage to the drive circuit in response to a second scan signal;

a first light emission control circuit, wherein the first light emission control circuit is connected in series with a light-emitting element between a positive voltage power supply and a second terminal of the drive circuit, and the first light emission control circuit is configured to be turned on in response to a light emission control signal so that a first power supply signal provided by the positive voltage power supply is transmitted through a cathode of the light-emitting element to the second terminal of the drive circuit;

a second light emission control circuit, wherein the second light emission control circuit is connected between a first terminal of the drive circuit and a negative voltage power supply and configured to be turned on in response to the light emission control signal;

a storage circuit, wherein the storage circuit is connected to the control terminal of the drive circuit and configured to store the potential at the control terminal of the drive circuit; and a second reset circuit electrically connected to the cathode of the light-emitting element, wherein the second reset circuit is configured to transmit a second reset signal to the cathode of the light-emitting element in response to a third scan signal, wherein a first terminal of the first light emission control circuit is connected to the positive voltage power supply, a second terminal of the first light emission control circuit is connected to an anode of the light-emitting element, and the cathode of the light-emitting element is connected to the second terminal of the drive circuit; the first reset circuit is configured to, in a gate reset stage, be turned on in response to the first scan signal and reset the control terminal of the drive circuit by using the first reset signal; the data write circuit is configured to, in a data write stage, be turned on in response to the second scan signal and transmit the data voltage to the drive circuit; the second reset circuit is configured to, in a cathode pre-charging stage, be turned on in response to the third scan signal and pre-charge the cathode of the light-emitting element by using the second reset signal; and the first light emission control circuit and the second light emission control circuit are configured to, in a light emission stage, be turned on in response to the light emission control signal so as to enable the drive circuit to generate the drive current according to the potential at the control terminal of the drive circuit and drive the light-emitting element to emit light.

12. The display panel according to claim 11, wherein the drive circuit of each pixel circuit of the plurality of pixel circuits comprises a drive transistor;

the display panel comprises an active layer, a first metal layer, a third metal layer, an anode layer, a light emission function layer and a cathode layer which are laminated;

a channel region of the drive transistor, a source region of the drive transistor and a drain region of the drive transistor are all disposed in the active layer;

a gate of the drive transistor is disposed in the first metal layer, and a projection of the gate of the drive transistor in a thickness direction of the display panel at least partially covers the channel region of the drive transistor; and a first electrode of the drive transistor and a second electrode of the drive transistor are both disposed in the third metal layer, and the first electrode of the drive transistor and the second electrode of the drive transistor are connected to the source region and the drain region of the drive transistor respectively.

13. The display panel according to claim 12, wherein the storage circuit accesses at least one fixed potential signal; and the display panel further comprises a second metal layer disposed between the first metal layer and the third metal layer, wherein the at least one fixed potential signal is provided by a fixed potential signal line, the fixed potential signal line is disposed in the second metal layer or the third metal layer, and a projection of the fixed potential signal line in the thickness direction of the display panel at least partially overlaps the gate of the drive transistor; an overlap between the fixed potential signal line and the gate of the drive transistor forms the storage circuit.

14. The display panel according to claim 13, wherein the positive voltage power supply is connected to each pixel circuit through a first power supply signal line, and the first power supply signal line is disposed in the second metal layer, the third metal layer or the anode layer.

15. The display panel according to claim 13, wherein the negative voltage power supply is connected to each pixel circuit through a second power supply signal line, and the second power supply signal line is disposed in the second metal layer, the third metal layer or the anode layer.

16. The display panel according to claim 11, further comprising a plurality of isolating structures disposed around light-emitting elements, wherein the isolating structures are configured to isolate cathodes of adjacent light-emitting elements;

an isolating structure of the plurality of isolating structures comprises a conductive material layer, a cathode of a light-emitting element is in contact with the isolating structure, and the cathode of the light-emitting element is connected to a corresponding pixel circuit through the isolating structure; and a shape of a section of the isolating structure is an inverted trapezoid.

* * * * *